US008703277B2

(12) United States Patent
Tokiwa et al.

(10) Patent No.: US 8,703,277 B2
(45) Date of Patent: Apr. 22, 2014

(54) CURABLE RESIN COMPOSITION

(75) Inventors: Tetsuji Tokiwa, Tokyo (JP); Takamitsu Utsumi, Tokyo (JP); Masaaki Endo, Tokyo (JP)

(73) Assignee: Asahi Kasei E-Materials Corporation, Tokyo (JP)

( * ) Notice: Subject to any disclaimer, the term of this patent is extended or adjusted under 35 U.S.C. 154(b) by 0 days.

(21) Appl. No.: 13/993,529

(22) PCT Filed: Dec. 16, 2011

(86) PCT No.: PCT/JP2011/079229
§ 371 (c)(1), (2), (4) Date: Jun. 12, 2013

(87) PCT Pub. No.: WO2012/081705
PCT Pub. Date: Jun. 21, 2012

(65) Prior Publication Data

US 2013/0266779 A1 Oct. 10, 2013

(30) Foreign Application Priority Data

Dec. 16, 2010 (JP) ................................. 2010-280500

(51) Int. Cl.
*C08G 65/00* (2006.01)

(52) U.S. Cl.
USPC ........ 428/195.1; 428/413; 174/258; 523/427; 525/523; 525/534; 528/87

(58) Field of Classification Search
USPC ......... 428/195.1, 413; 174/258; 525/523, 534
See application file for complete search history.

(56) References Cited

U.S. PATENT DOCUMENTS

| | | | |
|---|---|---|---|
| 5,258,455 | A | 11/1993 | Laughner et al. |
| 2004/0146692 | A1 | 7/2004 | Inoue et al. |
| 2008/0254257 | A1 | 10/2008 | Inoue et al. |
| 2013/0037305 | A1 | 2/2013 | Fournier et al. |

FOREIGN PATENT DOCUMENTS

| | | | |
|---|---|---|---|
| CN | 1745142 | A | 3/2006 |
| CN | 1867631 | A | 11/2006 |
| JP | 2-120357 | A | 5/1990 |
| JP | 4-31464 | A | 2/1992 |
| JP | 5-179136 | A | 7/1993 |
| JP | 6-207096 | A | 7/1994 |
| JP | 7-37567 | B2 | 4/1995 |
| JP | 8-231847 | A | 9/1996 |
| JP | 2002-26577 | A | 1/2002 |
| JP | 2003-515642 | A | 5/2003 |
| JP | 2005-290124 | A | 10/2005 |
| JP | 2007-30326 | A | 2/2007 |
| JP | 2008-260942 | A | 10/2008 |
| WO | WO 01/40354 | A1 | 6/2001 |

OTHER PUBLICATIONS

International Search Report for PCT/JP2011/079229 mailed on Mar. 6, 2012.

*Primary Examiner* — Elizabeth Mulvaney
(74) *Attorney, Agent, or Firm* — Birch, Stewart, Kolasch & Birch, LLP

(57) ABSTRACT

Provided is a curable resin composition which can provide a cured article having a low dielectric constant and a low dielectric tangent, and can also provide a cured article having excellent moldability at ordinary press-molding temperatures, excellent heat resistance and excellent adhesion properties. The present invention provides a curable resin composition containing a polyphenylene ether, wherein the average number of phenolic hydroxy groups is 0.3 or more per molecule of the polyphenylene ether, the resin flow amount of the curable resin composition upon curing is 0.3 to 15% inclusive, and a cured article having a dielectric tangent of 0.005 or less at 1 GHz and a glass transition temperature of 170° C. or higher can be produced.

11 Claims, No Drawings

CURABLE RESIN COMPOSITION

TECHNICAL FIELD

The present invention relates to a polyphenylene ether-containing curable resin composition suitable as an electronic substrate material. Furthermore, the present invention relates to a prepreg for a printed wiring board, containing the curable resin composition and a base material, and a printed wiring board containing a cured product of the curable resin composition and a base material.

BACKGROUND ART

Recent enhancement in bonding and mounting techniques is associated with high-density packaging of a semiconductor device mounted in electronic equipment as well as elaboration of a package and high-density wiring of a printed wiring board, and electronics are continuously progressing. In a printed wiring board constituting such electronic equipment, both multilayering and fine wiring are proceeding. For realizing speeding-up of signal transmission speed required so as to increase the information processing speed, it is effective to decrease the dielectric constant of the material used. A polyphenylene ether is excellent in high-frequency characteristics (i.e., dielectric characteristics) such as dielectric constant and dielectric loss tangent, and therefore is suitable as a material for a printed wiring board of electronic equipment utilizing a high frequency band.

As a technique for enhancing heat resistance and dimensional stability of a polyphenylene ether that is a thermoplastic resin, Patent Document 1 describes a resin composition containing a polyphenylene ether and a triallyl isocyanurate (TAIC). As a technique for enhancing chemical resistance, Patent Document 2 describes a resin composition containing a maleated polyphenylene ether providing a reaction product of a polyphenylene ether and maleic anhydride, and TAIC. However, in the resin composition described in Patent Document 1 or 2, the melting point of the resin itself is high to make the viscosity during melting too high at an ordinary press-molding temperature, and the resin composition cannot be easily filled to form an inner-layer conductor pattern layer of a multilayer printed wiring board. Thus, there is a problem that multilayering of a wiring board is difficult.

For the purpose of improving such a problem in moldability, Patent Document 3 describes a polyphenylene ether resin composition using a polyphenylene ether with a low molecular weight and thereby ensuring that the molten resin has good fluidity and the moldability at an ordinary press-molding temperature is excellent to enable multilayering. However, decreasing the molecular weight of a polyphenylene ether incurs a problem that the heat resistance of the obtained laminate sheet decreases and a problem that due to increase in the number of terminal hydroxyl groups of the polyphenylene ether, the dielectric loss tangent becomes large. Accordingly, this technique is also not sufficient to be used for a printed wiring board.

For the purpose of improving these problems posed by the decrease in the molecular weight of a polyphenylene ether, Patent Documents 4 and 5 describe use of a low-molecular-weight •terminal-sealed polyphenylene ether where the terminal hydroxyl group of a low-molecular-weight polyphenylene ether is sealed with a reactive functional group. It is believed that by using this polyphenylene ether, a cured product prevented from reduction in the heat resistance or reduction in the dielectric constant and dielectric loss tangent while maintaining good moldability at the press-molding is obtained. Furthermore, Patent Document 4 also describes a method of using the low-molecular-weight•terminal-sealed polyphenylene by mixing it with a normal polyphenylene ether. In Reference Example 7 of Patent Document 4, a polyphenylene ether having a number average molecular weight of 14,000 and a terminal-ethenylbenzylated polyphenylene ether having a number average molecular weight of 2,500 are used in a mixing ratio of 5:70, and in Reference Example 8, a polyphenylene ether having a number average molecular weight of 14,000 and a terminal-ethenylbenzylated polyphenylene ether having a number average molecular weight of 2,500 are used in a mixing ratio of 50:60.

The method of using a polyphenylene ether having a normal molecular weight by mixing it with a polyphenylene ether reduced in the molecular weight is also described, for example, in Patent Documents 6 and 7. Patent Document 6 describes a technique where for the purpose of enhancing the heat resistance of a low-molecular-weight •terminal-functionalized polyphenylene ether, from 0.1 to 9.1% of a normal polyphenylene ether is blended to the low-molecular-weight•terminal-functionalized polyphenylene ether.

Patent Document 7 describes a resin composition where a polyphenylene ether having a normal molecular weight and being functionalized with an acyl group or an electrophilic group (intrinsic viscosity: 0.35 dl/g or more) and a non-functionalized polyphenylene ether reduced in the molecular weight (intrinsic viscosity: approximately from 0.15 to 0.35 dl/g) are mixed in a ratio of 40 to 55:60 to 45.

RELATED ART

Patent Document

[Patent Document 1] Kokai (Japanese Unexamined Patent Publication) No. 8-231847

[Patent Document 2] Kokoku (Japanese Examined Patent Publication) No. 7-37567

[Patent Document 3] Kokai No. 2002-26577

[Patent Document 4] Kokai No. 2008-260942

[Patent Document 5] Kohyo (National Publication of Translated Version) No. 2003-515642

[Patent Document 6] Kokai No. 2005-290124

[Patent Document 7] U.S. Pat. No. 5,258,455

SUMMARY OF THE INVENTION

Problems to be Solved by the Invention

However, the low-molecular-weight terminal-functionalized polyphenylene ethers described in Patent Documents 4 and 5 have a problem presumed to be attributable to sealing of the terminal hydroxyl group. That is, these polyphenylene ethers have poor adhesiveness to a base material such as glass cloth, a copper foil and the like and in the case of a laminate sheet, and therefore the peel strength between layers or the peel strength between the polyphenylene ether and a copper foil or the like is low or the water absorption resistance and solder heat resistance are insufficient. In the laminate sheets described in Reference Examples 7 and 8 of Patent Document 4, the characteristics such as Tg, dielectric constant, dielectric loss tangent, moisture absorptivity and solder heat resistance are equal to those of a terminal-ethenylbenzylated polyphenylene ether alone and no enhancement of the characteristics is brought about by using a mixture of a low-molecular-weight•terminal-ethenylbenzylated polyphenylene ether and a normal polyphenylene ether.

Patent Document 6 only describes that by blending a polyphenylene ether having a normal molecular weight, the heat distortion temperature (HDT) of the cured resin sheet is increased from about 100° C. to about 110° C., but no description is found about the characteristics (particularly, moldability, peel strength, water absorption resistance, solder heat resistance and the like) of a composite of a resin cured product and a base material, which are required of a printed wiring board to which the present invention is applied.

Patent Document 7 only describes that the impact strength and the like of an extrusion-molded article are enhanced, but, similarly to Patent Document 6, no description is found about the characteristics (particularly, moldability, peel strength, water absorption resistance, solder heat resistance and the like) of a composite of a resin cured product and a base material, which are required of a printed wiring board to which the present invention is applied.

In this way, an insulating resin for a printed wiring board, having low dielectric constant and low dielectric loss tangent, which are inherent in a polyphenylene ether, and at the same time, being excellent in the moldability at the normal press temperature, heat resistance and adhesiveness, has not been found in the conventional techniques. Accordingly, an insulating resin for a printed wiring board, satisfying the above-described characteristics while using a polyphenylene ether as a constituent component, is strongly demanded.

Under these circumstances, an object of the present invention is to provide a curable resin composition capable of providing a cured product having low dielectric constant and low dielectric loss tangent, which are inherent in a polyphenylene ether, and providing a cured product exhibiting excellent moldability at a normal press-molding temperature and having high heat resistance and excellent adhesiveness (for example, peel strength between layer in a multilayer sheet or peel strength between a cured product of the curable resin composition and a metal foil such as copper foil); a prepreg for a printed wiring board, containing the resin composition and a base material; and a printed wiring board containing a cured product of the resin composition and a base material.

Means to Solve the Problems

The present inventors have made intensive studies and many experiments by taking notice of the molecular weight of a polyphenylene ether and the number of terminal hydroxyl groups, which affect various characteristics required of a material for a printed wiring board. As a result, it has been found that when the average number of phenolic hydroxyl groups per molecule of a polyphenylene ether is controlled to a specific range and preferably when a polyphenylene ether having a normal molecular weight is used as the main component and at the same time, a low-molecular-weight polyphenylene ether is blended in a specific amount, a curable resin composition excellent in moldability can be obtained and a cured product excellent in heat resistance and adhesiveness and low in the dielectric constant and dielectric loss tangent can be formed.

That is, the present invention is as follows.

[1] A curable resin composition comprising a polyphenylene ether, wherein:

the average number of phenolic hydroxyl groups per molecule of the polyphenylene ether is 0.3 or more, the resin flow rate of the curable resin composition at curing as measured under the following conditions is from 0.3 to 15%, a sample for dielectric loss tangent measurement produced from the curable resin composition under the following conditions has a dielectric loss tangent at 1 GHz of 0.005 or less, a sample for glass transition temperature measurement produced from the curable resin composition under the following conditions has a glass transition temperature of 170° C. or more, assuming that two 150 mm-square prepreg sheets obtained by impregnating a glass cloth specified by IPC Style 2116 with the curable resin composition to have a resin content of 60±2 mass % are stacked to obtain a laminate sheet precursor and a laminate sheet is produced by molding the laminate sheet precursor under the following condition (a) and removing the resin part flowed out, the resin flow rate at curing is a value calculated from the mass (g) of the laminate sheet and the mass (g) of the laminate sheet precursor according to the following formula:

Resin flow rate (%) at curing=(mass (g) of laminate sheet precursor−mass (g) of laminate sheet)/mass (g) of laminate sheet precursor×100, the sample for dielectric loss tangent measurement is molded under the following condition (a) after stacking 16 prepreg sheets obtained by impregnating a glass cloth specified by IPC Style 2116 with the curable resin composition to have a resin content of 60±2 mass %, and the sample for glass transition temperature measurement is molded under the following condition (a) after stacking 2 prepreg sheets obtained by impregnating a glass cloth specified by IPC Style 2116 with the curable resin composition to have a resin content of 60±2 mass %, Condition (a):

vacuum pressing is performed under the condition of a pressure of 5 kg/cm$^2$ while heating at a temperature rise rate of 3° C./min from room temperature; when reached 130° C., vacuum pressing is performed under the condition of a pressure of 30 kg/cm$^2$ while heating at a temperature rise rate of 3° C./min; and when reached 200° C., vacuum pressing is performed under the conditions of a pressure of 30 kg/cm$^2$ and a time for 60 minutes while maintaining the temperature at 200° C.

[2] The curable resin composition according to [1] above, wherein the polyphenylene ether contains a polyphenylene ether component having an average number of phenolic hydroxyl groups per molecule of less than 0.5 and having a number average molecular weight of 1,000 to 8,000, in an amount of 1 to 40 mass % based on the total amount of the polyphenylene ether.

[3] The curable resin composition according to [1] above, wherein the polyphenylene ether contains (A-1) a polyphenylene ether component having an average number of phenolic hydroxyl groups per molecule of less than 0.5 and having a number average molecular weight of 1,000 to 8,000, and (A-2) a polyphenylene ether component having a number average molecular weight in excess of 8,000, the content of the (A-1) is from 1 mass % to less than 40 mass % and the content of the (A-2) is from more then 60 mass % to 99 mass %, based on 100 mass % of the total mass of the (A-1) and the (A-2).

[4] The curable resin composition according to [2] or [3] above, wherein the (A-1) polyphenylene ether component having an average number of phenolic hydroxyl groups per molecule of less than 0.5 and having a number average molecular weight of 1,000 to 8,000 is a benzylated polyphenylene ether having a structure in which at least one phenolic hydroxyl group at the molecular terminal of a polyphenylene ether is substituted with a benzyl group.

[5] The curable resin composition according to any one of [1] to [4] above, containing (A) the polyphenylene ether, (B) a monomer having two or more vinyl groups within the molecule and (C) a reaction initiator, wherein the content of the monomer (B) is from 10 to 70 parts by mass and the content of the reaction initiator (C) is from 1 to 10 parts by mass, per 100 parts by mass of the total of the polyphenylene ether (A) and the monomer (B).

[6] The curable resin composition according to [5] above, wherein the monomer (B) is triallyl isocyanurate (TAIC).

[7] The curable resin composition according to [5] or [6] above, further containing a flame retardant.

[8] A prepreg for a printed wiring board, containing the curable resin composition according to any one of [1] to [7] above and a base material.

[9] A printed wiring board, containing a cured product of the curable resin composition according to any one of [1] to [7] above and a base material.

[10] A curable composition containing (A-1') a polyphenylene ether component having an average number of phenolic hydroxyl groups per molecule of less than 0.5 and having a number average molecular weight of 1,000 to 8,000.

Effects of the Invention

According to the present invention, a curable resin composition capable of providing a cured product having low dielectric constant and low dielectric loss tangent, which are inherent in a polyphenylene ether, and providing a cured product exhibiting excellent moldability at a normal press-molding temperature and having high heat resistance and excellent adhesiveness (for example, peel strength between layer in a multilayer sheet or peel strength between a cured product of the curable resin composition and a metal foil such as copper foil); a prepreg for a printed wiring board, containing the resin composition and a base material; and a printed wiring board containing a cured product of the resin composition and a base material, can be provided.

MODE FOR CARRYING OUT THE INVENTION

Embodiment examples of the present invention are described in detail below, but the present invention is not limited to these embodiments.

The polyphenylene ether contained in the curable resin composition of this embodiment preferably contains a repeating unit represented by the following formula (1):

[Chem. 1]

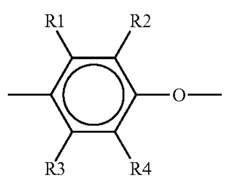

(1)

(wherein each of R1, R2, R3 and R4 independently represents hydrogen atom, a halogen atom, an alkyl group which may have a substituent, an alkoxy group which may have a substituent, an aryl group which may have a substituent, an amino group which may have a substituent, nitro group or carboxyl group).

Specific examples of the polyphenylene ether include poly(2,6-dimethyl-1,4-phenylene ether), poly(2-methyl-6-ethyl-1,4-phenylene ether), poly(2-methyl-6-phenyl-1,4-phenylene ether), poly(2,6-dichloro-1,4-phenylene ether), a copolymer of 2,6-dimethylphenol and other phenols (such as 2,3,6-trimethylphenol and 2,-methyl-6-butylphenol), and a polyphenylene ether copolymer obtained by coupling 2,6-dimethylphenol and biphenols or bisphenols, with poly(2,6-dimethyl-1,4-phenylene ether) being preferred.

The polyphenylene ether as used in this disclosure means a polymer composed of a substituted or unsubstituted phenylene ether unit structure but may contain other copolymerization components as long as the effects of the present invention are not impaired.

In one embodiment of the present invention, a polyphenylene ether-containing curable resin composition (hereinafter, also referred to as "polyphenylene ether-containing composition") is provided.

In one embodiment (hereinafter, also referred to as "first embodiment") of the present invention, the average number of phenolic hydroxyl groups per molecule of the polyphenylene ether is 0.3 or more. In one embodiment, the resin flow rate of the curable resin composition at curing as measured under the following conditions is from 0.3 to 15%. In one embodiment, a sample for dielectric loss tangent measurement produced from the curable resin composition under the following conditions has a dielectric loss tangent at 1 GHz of 0.005 or less. In one embodiment, a sample for glass transition temperature measurement produced from the curable resin composition under the following conditions has a glass transition temperature of 170° C. or more.

Assuming that two 150 mm-square prepreg sheets obtained by impregnating a glass cloth specified by IPC Style 2116 with the curable resin composition to have a resin content of 60±2 mass % are stacked to obtain a laminate sheet precursor and a laminate sheet is produced by molding the laminate sheet precursor under the following condition (a) and removing the resin part flowed out, the resin flow rate at curing is a value calculated from the mass (g) of the laminate sheet and the mass (g) of the laminate sheet precursor according to the following formula:

Resin flow rate (%) at curing=(mass (g) of laminate sheet precursor−mass (g) of laminate sheet)/mass (g) of laminate sheet precursor×100

The condition (a) is defined as follows: vacuum pressing is performed under the condition of a pressure of 5 kg/cm$^2$ while heating at a temperature rise rate of 3° C./min from room temperature; when reached 130° C., vacuum pressing is performed under the condition of a pressure of 30 kg/cm$^2$ while heating at a temperature rise rate of 3° C./min; and when reached 200° C., vacuum pressing is performed under the conditions of a pressure of 30 kg/cm$^2$ and a time for 60 minutes while maintaining the temperature at 200° C.

The sample for dielectric loss tangent measurement is molded under the condition (a) after stacking 16 prepreg sheets obtained by impregnating a glass cloth specified by IPC Style 2116 with the curable resin composition to have a resin content of 60±2 mass %.

The sample for glass transition temperature measurement is molded under the following condition (a) after stacking 2 prepreg sheets obtained by impregnating a glass cloth specified by IPC Style 2116 with the curable resin composition to have a resin content of 60±2 mass %.

The glass cloth specified by IPC Style 2116 is commercially available and, for example, available under the trade name of "2116" produced by Asahi-Schwebel Co., Ltd.

The resin flow rate at curing of the curable resin composition of the present invention is from 0.3 to 15%, preferably from 0.5 to 12%, more preferably from 1 to 10%. When the resin flow rate is 0.3% or more, moldability at a normal press-molding temperature is excellent and a cured product reduced in starvation and void as well as a laminate sheet containing the cured product can be formed. On the other hand, when the resin flow rate is 15% or less, in forming, for example, a laminate sheet containing a cured product of the curable resin composition and a base material, the deviation of stacking position in the laminate sheet can be reduced.

The resin flow rate at curing of the curable resin composition is defined as a value determined by the following method of this disclosure and more specifically, can be calculated using the following method.

As for the resin flow rate at curing, a 150 mm-square prepreg obtained by impregnating a glass cloth (IPC Style 2116) specified by IPC Style 2116 with the curable resin composition to have a resin content of 60±2 mass % is used as a test piece. The mass (g) of two test pieces is previously determined and taken as the mass of a laminate sheet precursor. Subsequently, two test pieces are stacked and heated/pressed under the condition (a). After removing the resin part flowed out from the 150-mm square, the obtained laminate is used as a laminate sheet. The mass of this laminate sheet is determined and taken as the mass (g) of the laminate sheet. The values obtained in this way are substituted in the formula above, whereby the resin flow rate at curing is determined.

Examples of the method for adjusting the resin flow rate at curing to fall in the above-described range include a method of adjusting the average number of phenolic hydroxyl groups per molecule of the polyphenylene ether, a method of adjusting the resin flow rate by mixing the later-described low-molecular-weight •terminal-functionalized polyphenylene ether (A-1) and the component (A-2) and changing the mixing ratio therebetween, and a method of blending the later-described monomer having two or more vinyl groups within the molecule and adjusting the blending amount thereof.

Also, the dielectric loss tangent of a cured product sample produced from the curable resin composition of this embodiment under the conditions of this disclosure is 0.005 or less at 1 GHz. A printed wiring board having a dielectric loss tangent of 0.005 or less at 1 GHz responds to speeding-up of the signal transmission speed required so as to increase the information processing speed and therefore, is demanded. The curable resin composition provided by the present invention can give a cured product composite having a dielectric loss tangent of 0.005 or less at 1 GHz. Accordingly, by using such a curable resin composition, a printed wiring board enabling speeding-up of the signal transmission speed can be formed.

The cured product sample for dielectric loss tangent measurement is produced by a method of stacking 16 prepreg sheets obtained by impregnating a glass cloth (IPC Style 2116) specified by IPC Style 2116 with the curable resin composition to have a resin content of 60±2 mass % and molding the laminate by hot pressure forming under the condition (a).

The dielectric loss tangent at 1 GHz of the cured product sample above is preferably 0.003 or less, more preferably 0.001 or less. The dielectric loss tangent is preferably smaller but in view of electrical characteristics inherent in the polyphenylene ether, may be preferably 0.0005 or more, more preferably 0.0007 or more.

The dielectric loss tangent of the cured product sample above is a value determined using the following formula after measuring the capacitance Cp [F] and conductance G [S] at 1 MHz to 1 GHz under the condition of 500 mV by the impedance analyzer method:

$$\in r=(t\times Cp)/\{\pi\times(d/2)^2\times\in 0$$

(t: thickness [m] of sample, d: diameter of electrode, f: measurement frequency [Hz], ∈0: dielectric constant of vacuum=$8.854\times10^{-12}$ [F/m]).

Also, in the curable resin composition of this embodiment, the glass transition temperature of a cured product sample produced by the method above of this disclosure (specifically, a sample produced by the same method as the production method of the sample for dielectric loss tangent measurement except for stacking 2 prepreg sheets in place of stacking 16 prepreg sheets) is 170° C. or more, preferably 180° C. or more, more preferably 190° C. or more. The glass transition temperature of the sample above corresponds to the glass transition temperature of a cured product obtained by curing the curable resin composition under typical use conditions. The cured product having a glass transition temperature of 170° C. or more exhibits good heat resistance (particularly solder heat resistance against lead-free solder). The glass transition temperature of the cured product is preferably higher but in view of applicability to the usage environment of the cured product, the glass transition temperature of the sample may be preferably 300° C. or less, more preferably 250° C. or less.

The glass transition temperature of the sample is a value measured using a viscoelastic spectrometer in the twisting mode under the condition of a frequency of 10 rad/s.

Examples of the method for adjusting the glass transition temperature to fall in the above-described range include a method of adjusting the average number of phenolic hydroxyl groups per molecule of the polyphenylene ether, a method of mixing the later-described component (A-1) and the component (A-2) and adjusting the mixing ratio therebetween, and a method of blending the later-described monomer having two or more vinyl groups within the molecule and adjusting the blending amount thereof.

The average number of phenolic hydroxyl groups per molecule of said polyphenylene ether contained in the curable resin composition of the present invention is 0.3 or more. The average number of phenolic hydroxyl groups per molecule of said polyphenylene ether is preferably 0.7 or more, more preferably 0.9 or more, sill more preferably 1.05 or more. When a polyphenylene ether in which the average number of phenolic hydroxyl groups per molecule is 0.3 or more is used in the curable resin composition, the adhesiveness of a cured product of the resin composition to a base material (such as glass cloth) or the adhesiveness of a cured product of the resin composition to a metal foil such as copper foil is improved, and the printed wiring board is advantageously excellent in the water absorption resistance, solder heat resistance and adhesiveness (for example, peel strength between layer in a multilayer sheet or peel strength between the cured product and a copper foil or the like). From the standpoint that the water absorption of a composite (for example, a laminate sheet) containing a cured product of the curable resin composition and a base material can be prevented from increasing or the dielectric constant and dielectric loss tangent of the composite can be prevented from becoming high, the average number of phenolic hydroxyl groups is preferably 2.0 or less, more preferably 1.85 or less, still more preferably 1.6 or less.

The average number of phenolic hydroxyl groups per molecule of the polyphenylene ether in this disclosure is defined as a value determined by the following method. In accordance with the method described in *Kobunshi Ronbunshu* (*Collec-*

*tion of Papers on Polymers*), Vol., 51, No. 7, page 480 (1994), the number of hydroxyl groups is determined from the value obtained by adding a tetramethylammonium hydroxide solution to a methylene chloride solution of polyphenylene ether and measuring this sample for the change of absorbance at a wavelength of 318 nm by an ultraviolet-visible absorptiometer. Separately, the number average molecular weight of the polyphenylene ether is determined by gel permeation chromatography, and the number of molecules of the polyphenylene ether is determined using the obtained value. From these values, the average number of hydroxyl groups per molecule of the polyphenylene ether is calculated according to the following formula:

Average number of phenolic hydroxyl groups per molecule=number of hydroxyl groups/number-average number of molecules The average number of phenolic hydroxyl groups per molecule of the polyphenylene ether can be adjusted, for example, by mixing a polyphenylene ether in which a phenolic hydroxyl group at the molecular terminal remains, and a polyphenylene ether in which a phenolic hydroxyl group at the molecular terminal is modified with another functional group, and changing the mixing ratio therebetween, or may be also adjusted by changing the degree of substitution with another functional group on the phenolic hydroxyl group at the molecular terminal. The functional group above is not particularly limited in its embodiment and may be a benzyl group, an allyl group, a propargyl group, a glycidyl group, a vinylbenzyl group, a methacryl group or the like. Among these, a benzyl group is preferred, because, for example, this is easily available in industry due to good reaction efficiency, not reactive by itself, thereby ensuring excellent stability, and remarkably effective in reducing the melt viscosity of the polyphenylene ether-containing composition during press-forming.

The polyphenylene ether for use in this embodiment preferably contains (A-1) a polyphenylene ether component having an average number of phenolic hydroxyl groups per molecule of less than 0.5 and having a number average molecular weight of 1,000 to 8,000 (hereinafter, also referred to as "low-molecular-weight•terminal-functionalized polyphenylene ether), in an amount of 1 to 40 mass % based on the total amount of the polyphenylene ether. The content of the low-molecular-weight•terminal-functionalized polyphenylene ether is more preferably from 1.2 to 30 mass %, still more preferably from 1.5 to 25 mass %.

The number average molecular weight of the polyphenylene ether in this disclosure is a value measured in terms of standard polystyrene by using the gel permeation chromatography (GPC). Typically, GPC measurement is performed using Shodex LF-804x2 (manufactured by Showa Denko K.K.) for the column, chloroform at 50° C. for the eluent, and R1 (refractometer) for the detector, and from the relational expression of the molecular weight of a standard polystyrene sample measured under the same conditions and the dissolution time, the number average molecular weight is calculated.

The curable resin composition containing a polyphenylene ether containing the (A-1) low-molecular-weight •terminal-functionalized polyphenylene ether in an amount of 1 mass % or more is preferred in that the melt viscosity of the curable resin composition at the molding is small and good moldability is obtained. On the other hand, the curable resin composition containing a polyphenylene ether containing the low-molecular-weight •terminal-functionalized polyphenylene ether in an amount of 40 mass % or less is preferred in that the low-molecular-weight •terminal-functionalized polyphenylene ether can prevent its feature of poor adhesiveness from clearly emerging and the water absorption resistance, solder heat resistance and adhesiveness (for example, peel strength between layer in a multilayer sheet or peel strength between a cured product of the curable resin composition and a copper foil or the like) of a cured product, which are required in a printed wiring board and the like, are satisfied.

The average number of phenolic hydroxyl groups per molecule of the low-molecular-weight•terminal-functionalized polyphenylene ether (A-1) is preferably less than 0.5, more preferably 0.2 or less, still more preferably 0.1 or less. When the average number of phenolic hydroxyl groups per molecule is less than 0.5, this is preferred in that the curable resin composition containing the low-molecular-weight•terminal-functionalized polyphenylene ether can form a cured product having a low dielectric constant and a low dielectric loss tangent and in addition, by virtue of having good curing reactivity, a cured product excellent in the mechanical characteristics and heat resistance is obtained. The average number of phenolic hydroxyl groups is preferably smaller and may be 0 but in view of efficiency in modifying the phenolic hydroxyl group with another functional group, is preferably 0.001 or more, more preferably 0.01 or more.

The number average molecular weight of the low-molecular-weight •terminal-functionalized polyphenylene ether (A-1) is preferably from 1,000 to 8,000, more preferably from 1,000 to 5,000, still more preferably from 2,000 to 4,000. When the number average molecular weight is 8,000 or less, the curable resin composition containing the low-molecular-weight•terminal-functionalized polyphenylene ether shows a low melt viscosity during molding and good moldability is obtained. On the other hand, when the number average molecular weight is 1,000 or more, this is preferred in that the curable resin composition containing the low-molecular-weight terminal-functionalized polyphenylene ether can form a cured product having a low dielectric constant and a low dielectric loss tangent and having good heat resistance and mechanical characteristics.

The functional group at the terminal in the low-molecular-weight terminal-functionalized polyphenylene ether (A-1) is not particularly limited in its embodiment and may be a benzyl group, an allyl group, a propargyl group, a glycidyl group, a vinylbenzyl group, a methacryl group or the like. Among others, the low-molecular-weight •terminal-functionalized polyphenylene ether is preferably a benzylated polyphenylene ether having a structure in which at least one phenolic hydroxyl group at the molecular terminal of a polyphenylene ether is substituted with a benzyl group, because, for example, this is easily available in industry due to good reaction efficiency, not reactive by itself, thereby ensuring excellent stability, and remarkably effective in reducing the melt viscosity of the later-described component (A-2) at the press-forming.

In the benzylated polyphenylene ether above, the average number of phenolic hydroxyl groups per molecule may be less than 0.5 and the number average molecular weight may be from 1,000 to 8,000. The benzylated polyphenylene ether means a polymer having a structure in which a substituted or unsubstituted benzyl group is bonded to the molecular chain terminal of a substituted or unsubstituted polyphenylene ether.

More typically, the benzylated polyphenylene ether of this disclosure has a structure represented by the following formula (2):

[Chem. 2]

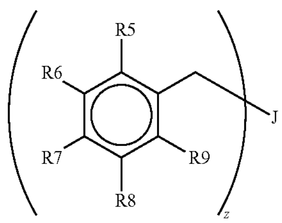

(2)

[wherein each of R5, R6, R7, R8 and R9 independently represents hydrogen atom, an alkyl group or a halogen, Z is an integer of 1 to 5, and J represents a polyphenylene ether molecular chain containing a unit structure represented by the following formula (1):

[Chem. 3]

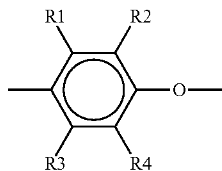

(1)

(wherein R1, R2, R3 and R4 are as defined above)].

J may be constituted to contain, as the unit structure, substantially only a structure represented by formula (1) but, according to the purpose, may contain a copolymerization component other than the unit structure represented by formula (1).

In formula (2), in view of reaction efficiency, it is preferred that all of R5, R6, R7, R8 and R9 are hydrogen atom.

In formula (2), J is preferably a poly(2,6-dimethyl-1,4-phenylene ether) structure, because control of the molecular weight during polymerization is relatively easy and synthesis of a polymer having an optimal molecular weight distribution for usage is facilitated. J is also preferably a copolymer structure obtained by reacting a poly(2,6-dimethyl-1,4-phenylene ether) and a phenol compound in the presence of an organic peroxide. The phenol compound used here is not particularly limited as long as it has one or more phenolic hydroxyl group within the molecule, but specific examples thereof include phenol, cresol, 2,6-xylenol, 2,3,6-trimethylphenol, bisphenol A, biphenol, and cresol•novolak skeleton phenol. In view of high reaction rate, 2,6-xylenol, bisphenol A and cresol•novolak skeleton phenol are preferably used.

The number average molecular weight of the benzylated polyphenylene ether may be from 1,000 to 8,000 and is preferably from 1,000 to 5,000, more preferably from 2,000 to 4,000. When the number average molecular weight is 8,000 or less, the benzylated polyphenylene ether exhibits excellent solubility for a solvent and in particular, when 4,000 or less, this component dissolves at a concentration of 30 mass % or more in toluene at room temperature (23° C.). On the other hand, when the number average molecular weight is 1,000 or more, the dielectric constant and dielectric loss tangent of a cured product of the curable resin composition containing the benzylated polyphenylene ether can be reduced and at the same time, the heat resistance and mechanical characteristics of the cured product are excellent. Particularly, when 2,000 or more, this is preferred because the dielectric constant and dielectric loss tangent can be more reduced.

The average number of phenolic hydroxyl groups per molecule of the benzylated polyphenylene ether may be less than 0.5 and is preferably less than 0.2, more preferably less than 0.1. When the average number of phenolic hydroxyl groups is less than 0.5, the dielectric constant and dielectric loss tangent of a cured product of the curable resin composition containing the benzylated polyphenylene ether are low and moreover, because of high curing reactivity of the composition, a cured produce excellent in the mechanical characteristics and heat resistance is obtained. The average number of phenolic hydroxyl groups is preferably smaller and may be 0 but in view of efficiency in modifying the phenolic hydroxyl group with another functional group, is preferably 0.001 or more, more preferably 0.01 or more.

The benzylated polyphenylene ether can be obtained typically be the reaction of a polyphenylene ether with a benzyl compound, for example, is obtained by the reaction of a phenolic hydroxyl group contained in the raw material polyphenylene ether (for example, a polyphenylene ether containing a unit structure represented by formula (1)) with a benzyl compound represented by the following formula (3):

[Chem. 4]

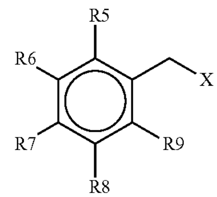

(3)

(wherein R5, R6, R7, R8 and R9 are as defined in formula (2), and X represents a halogen atom or a cyano group).

In formula (3), X includes F, Cl, Br, I, CN and the like. Specific examples of the benzyl compound represented by formula (3) include benzyl chloride, benzyl cyanide, benzyl bromide, methylbenzyl chloride, methylbenzyl bromide, dimethylbenzyl chloride, dimethylbenzyl bromide, trimethylbenzyl chloride, and trimethylbenzyl bromide. Among these, benzyl chloride is preferred, because this is highly reactive with a phenolic hydroxyl group and a benzylated polyphenylene ether having a small number of phenolic hydroxyl groups can be easily produced.

The production method of the benzylated polyphenylene ether is not particularly limited but includes, for example, a method of reacting a polyphenylene ether and a benzyl compound in a solution such as toluene and xylene by using a strong alkali compound as the catalyst. Examples of the strong alkali compound include a metal hydroxide such as sodium hydroxide, potassium hydroxide and calcium hydroxide, and an alcoholate such as sodium methylate and sodium ethylate.

In a preferred embodiment, the above-described low-molecular-weight•terminal-functionalized polyphenylene ether is combined with (A-2) a polyphenylene ether having a number average molecular weight in excess of 8,000. In this component (A-2), the number of terminal phenolic hydroxyl groups is preferably larger than that in the low-molecular-weight•terminal-functionalized polyphenylene ether, and it is more preferred that the average number of phenolic hydroxyl groups per molecule is 0.5 or more.

Above all, in the case where the polyphenylene ether contains the low-molecular-weight•terminal-functionalized polyphenylene ether in an amount of 1 to 40 mass %, the polyphenylene ether preferably contains a polyphenylene ether component (hereinafter, also referred to as "unfunctionalized polyphenylene ether") in which the average number of phenolic hydroxyl groups per molecule is 0.5 or more and the number average molecular weight is from more than 8,000 to 40,000.

In a preferred embodiment, the polyphenylene ether contains (A-1) a polyphenylene ether component having an average number of phenolic hydroxyl groups per molecule of less than 0.5 and having a number average molecular weight of 1,000 to 8,000, and (A-2) a polyphenylene ether component having an average number of phenolic hydroxyl groups per molecule of 0.5 or more and having a number average molecular weight in excess of 8,000, wherein the content of (A-1) is from 1 mass % to less than 40 mass % and the content of (A-2) is from more then 60 mass % to 99 mass %, based on 100 mass % of the total mass of (A-1) and (A-2).

In this embodiment, the polyphenylene ether preferably consists of substantially (A-1) and (A-2) and more preferably consists of (A-1) and (A-2).

By the use of the component (A-2), a high glass transition temperature attributable to the polyphenylene ether having a large molecular weight is obtained. Also, by the use of the component (A-2) in the preferred embodiment, good adhesiveness attributable to the terminal hydroxyl group is obtained, and excellent heat resistance, mechanical characteristics and adhesiveness are advantageously achieved.

From the standpoint of realizing good adhesiveness, the average number of phenolic hydroxyl groups per molecule of the component (A-2) is preferably 0.5 or more, more preferably 0.8 or more, still more preferably 1.6 or more. The average number of phenolic hydroxyl groups is preferably larger in terms of obtaining the above-described effects, but from the standpoint of preventing increase in the water absorption of a cured product composite containing a cured product of the curable resin composition and a base material or preventing the dielectric constant and dielectric loss tangent from becoming high, the average number of phenolic hydroxyl groups may be preferably 2 or less, more preferably 1.85 or less, still more preferably 1.6 or less.

The number average molecular weight of (A-2) is preferably from more than 8,000 to 40,000, more preferably from 9,500 to 28,000, still more preferably from 10,000 to 20,000. When the number average molecular weight exceeds 8,000, a high glass transition temperature is obtained and therefore, a cured product excellent in the heat resistance and mechanical characteristics is advantageously obtained. On the other hand, when the number average molecular weight is 40,000 or less, this is preferred because the melt viscosity is kept low at a normal press-forming temperature and good moldability is obtained.

The content of (A-2) is, from the standpoint of realizing a high glass transition temperature and good adhesiveness, preferably 60 mass % or more, more preferably in excess of 60 mass %, still more preferably 70 mass % or more, yet still more preferably 75 mass % or more, and from the standpoint of reducing the melt viscosity of the curable resin composition at the molding and obtaining good moldability, preferably 99 mass % or less, more preferably 98.8 mass % or less, still more preferably 98.5 mass % or less, based on 100 mass % of the total mass of (A-1) and (A-2). In another preferred embodiment, (A-1):(A-2) is from 5:95 to 30:80 on the mass basis.

In the composition of this embodiment, various components described with respect to some embodiments of the present invention, such as reaction initiator, flame retardant, other resins and other additives, may be preferably blended in the same way as in those embodiments. This disclosure encompasses such blending. Also, a varnish, a prepreg and a printed wiring board may be preferably formed using the composition of this embodiment in the same mode as in other embodiments of the present invention.

Another embodiment of the present invention (hereinafter, also referred to as "second embodiment") contains, as the polyphenylene ether, (A-1') a polyphenyl ether component having an average number of phenolic hydroxyl groups per molecule of less than 0.5 and having a number average molecular weight of 1,000 to 8,000 (hereinafter, also referred to as "component (A-1')").

Examples of the component (A-1') are the same as those of the low-molecular-weight•terminal-functionalized polyphenylene ether (A-1). The functional group at the terminal in the low-molecular-weight•terminal-functionalized polyphenylene ether is not particularly limited in its embodiment and may be a benzyl group, an allyl group, a propargyl group, a glycidyl group, a vinylbenzyl group, a methacryl group or the like. Among others, the low-molecular-weight•terminal-functionalized polyphenylene ether is preferably a benzylated polyphenylene ether having a structure in which at least one phenolic hydroxyl group at the molecular terminal of a polyphenylene ether is substituted with a benzyl group, because, for example, this is easily available in industry due to good reaction efficiency, not reactive by itself, thereby ensuring excellent stability, and remarkably effective in reducing the melt viscosity of the later-described unfunctionalized polyphenylene ether at the press-forming. As for such a benzylated polyphenylene ether, the description of the benzylated polyphenylene ether in the first embodiment can be directly applied.

This benzylated polyphenylene ether has the advantage of exhibiting excellent solubility for a solvent (for example, various solvents used in the varnish of this disclosure) without impairing the low dielectric constant and low dielectric loss tangent inherent in the polyphenylene ether. The benzylated polyphenylene ether having such characteristics can be suitably used, for example, in the production of an electronic substrate including thermal curing. Due to the small number of phenolic hydroxyl groups contained in the benzylated polyphenylene ether, the curable resin composition containing the benzylated polyphenylene ether (in this disclosure, also referred to as "benzylated polyphenylene ether-containing composition") can form a cured product having a low dielectric constant and a low dielectric loss tangent and also, can have high curing reactivity. This composition can form a cured product having excellent mechanical characteristics and heat resistance. An example of the benzylated polyphenylene ether-containing composition is a composition containing the benzylated polyphenylene ether and a monomer having two or more vinyl groups within the molecule. Details of the preferred embodiment of the monomer having two or more vinyl groups within the molecule are the same as those described with respect to some embodiments of the present invention.

In this embodiment, for the purpose of adjusting the viscosity of a varnish of the composition and improving the moldability of a cured product of the composition, (A-2') a polyphenylene ether having a number average molecular weight in excess of 8,000 (hereinafter, also referred to as "component (A-2')") may be further incorporated. As for more preferred examples of the number average molecular weight of the component (A-2'), for example, the number average molecular weight is more preferably from more than 8,000 to 40,000, still more preferably from 9,500 to 28,000, yet still more preferably from 10,000 to 20,000.

In a preferred embodiment, the polyphenylene ether contains (A-1') a polyphenylene ether component having an average number of phenolic hydroxyl groups per molecule of less than 0.5 and having a number average molecular weight of 1,000 to 8,000, and (A-2') a polyphenylene ether component having an average number of phenolic hydroxyl groups per molecule of 0.5 or more and having a number average molecular weight in excess of 8,000, wherein the content of (A-1') is from 1 mass % to less than 40 mass % and the content of (A-2') is from more than 60 mass % to 99 mass %, based on 100 mass % of the total mass of (A-1') and (A-2').

By the use of the component (A-2'), a high glass transition temperature attributable to the polyphenylene ether having a large molecular weight and good adhesiveness attributable to the terminal hydroxyl group are obtained, and excellent heat resistance, mechanical characteristics and adhesiveness are advantageously achieved.

From the standpoint of realizing good adhesiveness, the average number of phenolic hydroxyl groups per molecule of the component (A-2') is, for example, 0.5 or more, preferably 0.8 or more, more preferably 1.6 or more. The average number of phenolic hydroxyl groups is preferably larger in terms of obtaining the above-described effects, but from the standpoint of preventing increase in the water absorption of a cured product composite containing a cured product of the curable resin composition and a base material or preventing the dielectric constant and dielectric loss tangent from becoming high, the average number of phenolic hydroxyl groups may be preferably 2 or less, more preferably 1.85 or less, still more preferably 1.6 or less.

The number average molecular weight of the unfunctionalized polyphenylene ether is preferably from more than 8,000 to 40,000, more preferably from 9,500 to 28,000, still more preferably from 10,000 to 20,000. When the number average molecular weight exceeds 8,000, a high glass transition temperature is obtained and therefore, a cured product excellent in the heat resistance and mechanical characteristics is advantageously obtained. On the other hand, when the number average molecular weight is 40,000 or less, this is preferred because the melt viscosity is kept low at a normal press-forming temperature and good moldability is obtained.

The amount of the component (A-2') used is preferably from 5 to 95 parts by mass, more preferably from 40 to 80 parts by mass, per 100 parts by mass of the total of the component (A-1') and the later-described monomer (B).

The amount of (A-2') used is, from the standpoint of realizing a high glass transition temperature and good adhesiveness, preferably 60 parts by mass or more, more preferably in excess of 60 parts by mass, still more preferably 70 parts by mass or more, yet still more preferably 75 parts by mass or more, and from the standpoint of reducing the melt viscosity of the curable resin composition and obtaining good moldability, preferably 99 parts by mass or less, more preferably 98.8 parts by mass or less, still more preferably 98.5 parts by mass or less, per 100 parts by mass of the total of the component (A-1') and the component (A-2'). In another preferred embodiment, (A-1'):(A-2') is from 5:95 to 30:80 on the mass basis.

In this embodiment, the polyphenylene ether preferably consists of substantially (A-1') and (A-2') and more preferably consists of (A-1') and (A-2').

In the composition of this embodiment, various components described with respect to some embodiments of the present invention, such as reaction initiator, flame retardant, other resins and other additives, may be preferably blended in the same way as in those embodiments. This disclosure encompasses such blending. Also, a varnish, a prepreg and a printed wiring board may be preferably formed using the composition of this embodiment in the same mode as in other embodiments of the present invention.

Still another embodiment of the present invention provides a curable resin composition containing (A) a polyphenyl ether that is the above-described polyphenyl ether, and (B) a monomer having two or more vinyl groups within the molecule. This curable resin composition contains the (B) monomer having two or more vinyl groups within the molecule in an amount of preferably from 5 to 95 parts by mass, more preferably from 10 to 80 parts by mass, still more preferably from 10 to 70 parts by mass, yet still more preferably from 20 to 70 parts by mass, per 100 parts by mass of the total of the polyphenylene ether (A) and the (B) monomer having two or more vinyl groups within the molecule. When the amount of the monomer (B) is 5 parts by mass or more, good moldability is advantageously obtained, and when the amount is 95 parts by mass or less, this is preferred in that a cured product having a low dielectric constant and a low dielectric loss tangent can be formed.

In the curable composition, the compositional ratio (a')/(b) of the content (a') of the component (A-1) or component (A-1') to the content (b) of the monomer having two or more vinyl groups within the molecule (preferably TAIC) is preferably from 5/95 to 95/5 (by mass). When the compositional ratio is 5/95 or more, the dielectric constant and dielectric loss tangent of the obtained cured product are advantageously low, and when the compositional ratio is 95/5 or less, the moldability is good. The compositional ratio is more preferably from 20/80 to 90/10, still more preferably from 30/70 to 80/20.

In this disclosure, the monomer having two or more vinyl groups within the molecule includes, for example, triallyl isocyanurate (TAIC), triallyl cyanurate, triallylamine, triallyl mesate, divinylbenzene, divinylnaphthalene, and divinylbiphenyl, but TAIC having good compatibility with the polyphenylene ether is preferred.

The curable resin composition of this embodiment more preferably contains (A) a polyphenylene ether, (B) a monomer having two or more vinyl groups within the molecule, and (C) a reaction initiator.

As the reaction initiator (C), an arbitrary initiator having an ability of accelerating a polymerization reaction of a vinyl monomer can be used, and examples thereof include a peroxide such as benzoyl peroxide, cumene hydroperoxide, 2,5-dimethylhexane-2,5-dihydroperoxide, 2,5-dimethyl-2,5-di(tert-butylperoxy)hexine-3, di-tert-butyl peroxide, tert-butylcumyl peroxide, α,α'-bis(tert-butylperoxy-m-isopropyl)benzene, 2,5-dimethyl-2,5-di(tert-butylperoxy)hexane, dicumyl peroxide, di-tert-butyl peroxyisophthalate, tert-butyl peroxybenzoate, 2,2-bis(tert-butylperoxy)butane, 2,2-bis(tert-butylperoxy)octane, 2,5-dimethyl-2,5-di(benzoylperoxy)hexane, di(trimethylsilyl)peroxide and trimethylsilyltriphenylsilyl peroxide. Also, a radical generator such as 2,3-dimethyl-2,3-diphenylbutane may be used as the reaction initiator. Among these, from the standpoint that a cured product being excellent in the heat resistance and mechanical characteristics and furthermore, having a low dielectric constant and a low dielectric loss tangent can be obtained, 2,5-dimethyl-2,5-di(tert-butylperoxy)hexine-3, α,α'-bis(tert-butylperoxy-m-isopropyl)benzene and 2,5-dimethyl-2,5-di (tert-butylperoxy)hexane are preferred.

The content of the reaction initiator (C) is, from the standpoint that the reaction rate can be made high, preferably 0.5 parts by mass or more, more preferably 1 part by mass or more, still more preferably 1.5 parts by mass or more, and from the standpoint that the dielectric constant and dielectric loss tangent of the obtained cured product can be kept low, preferably 15 parts by mass or less, more preferably 10 parts by mass or less, still more preferably 7 parts by mass or less, per 100 parts by mass of the total of the polyphenylene ether (A) and the monomer (B).

In a preferred embodiment, per 100 parts by mass of the total of the polyphenylene ether (A) and the monomer (B), the content of the monomer (B) is from 10 to 70 parts by mass and the content of the reaction initiator (C) is from 1 to 10 parts by mass.

In the curable resin composition of the present invention, another resin (for example, a thermoplastic resin or a hardening resin) may be further incorporated. Examples of the thermoplastic resin include a homopolymer of a vinyl compound such as ethylene, propylene, butadiene, isoprene, styrene, divinylbenzene, methacrylic acid, acrylic acid, methacrylic acid ester, acrylic acid ester, vinyl chloride, acrylonitrile, maleic anhydride, vinyl acetate and tetrafluoroethylene, a copolymer of two or more these vinyl compounds, polyamide, polyimide, polycarbonate, polyester, polyacetal, polyphenylene sulfide, and polyethylene glycol. Among these, a homopolymer of styrene, a styrene-butadiene copolymer, and a styrene-ethylene-butadiene copolymer may be preferably used in view of solubility of the curable composition in a solvent and moldability. Examples of the hardening resin include a phenol resin, an epoxy resin and cyanate esters. The above-described thermoplastic resin and hardening resin may be a resin modified with a functional compound such as acid anhydride, epoxy compound and amine. The amount of such another resin used is preferably from 10 to 90 parts by mass, more preferably from 20 to 70 parts by mass, per 100 parts by mass of the total of the polyphenylene ether (A) and the monomer (B).

The curable resin composition of the present invention may further contain appropriate additives according to the purpose. Examples of the additive include a flame retardant, a heat stabilizer, an antioxidant, a UV absorber, a surfactant, a lubricant, a filler, and a polymer additive.

Above all, the curable resin composition of the present invention preferably further contains a flame retardant, because flame retardance can be imparted, in addition to the advantage that a printed wiring board or the like excellent in the moldability, solder heat resistance and adhesiveness (for example, peel strength between layer in a multilayer sheet or peel strength between a cured product and a copper foil or the like), which are ensured in the present invention, can be obtained.

The flame retardant is not particularly limited as long as it has a function inhibiting the mechanism of combustion, and examples thereof include an inorganic flame retardant such as antimony trioxide, aluminum hydroxide, magnesium hydroxide and zinc borate, and an aromatic bromine compound such as hexabromobenzene, decabromodiphenylethane, 4,4-dibromophenyl and ethylene bistetrabromophthalimide. Among these, from the standpoint that the dielectric constant and dielectric loss tangent of the obtained cured product can be kept low, for example, decabromodiphenylethane is preferred.

The amount of the flame retardant used varies depending on the flame retardant used and is not particularly limited, but in terms of maintaining flame retardance in a level of 94V-0 of the UL Standards, the amount used is preferably 5 parts by mass or more, more preferably 10 parts by mass or more, still more preferably 15 parts by mass or more, per 100 parts by mass of the total of the polyphenylene ether (A) and the monomer (B). Also, from the standpoint that the dielectric constant and dielectric loss tangent of the obtained cured product can be kept low, the amount used is preferably 50 parts by mass or less, more preferably 45 parts by mass or less, still more preferably 40 parts by mass or less.

A varnish containing the above-described curable resin composition is also disclosed. The varnish can be formed by dissolving or dispersing the curable resin composition of the present invention in a solvent. A base material such as glass cloth is impregnated with the varnish and thereafter, the solvent portion is removed by drying, whereby a prepreg suitable, for example, as a material of an insulating layer of a substrate material can be produced.

Examples of the solvent used for the varnish include toluene, xylene, methyl ethyl ketone, and acetone. One of these solvents may be used alone, or two or more thereof may be mixed and used. Also, for example, one or more of various solvents described above may be combined with alcohols such as methanol. From the standpoint of successfully controlling the impregnation of the varnish for a base material and the amount of the resin attached to a base material, the proportion of the curable resin composition in the varnish is preferably from 5 to 95 parts by mass, more preferably from 20 to 80 parts by mass, per 100 parts by mass of the total amount of the varnish.

In another embodiment of the present invention, a prepreg containing the curable resin composition of the present invention and a base material is provided. The prepreg is typically a prepreg for a printed wiring board. A typical prepreg is a composite of the curable resin composition and a base material, obtained by impregnating a base material with a varnish containing the curable resin composition and thereafter, volatilizing the solvent portion by a hot-air drier or the like. As the base material, one of various glass cloths such as roving cloth, cloth, chopped mat and surfacing mat; an asbestos cloth, a metal fiber and other synthetic or natural inorganic fiber cloths; woven or nonwoven fabrics obtained from a liquid crystal fiber such as wholly aromatic polyamide fiber, wholly aromatic polyester fiber and polybenzoxazole fiber; natural fiber cloths such as cotton cloth, hemp cloth and felt; a carbon fiber cloth; natural cellulose base materials such as craft paper, cotton paper and cloth obtained from a paper-glass mixed yarn; polytetrafluoroethylene porous films; and the like, may be used alone, or two or more thereof may be used in combination.

The proportion of the curable resin composition in the prepreg is preferably from 30 to 80 parts by mass, more preferably from 40 to 70 parts by mass, per 100 parts by mass of the total amount of the prepreg. When the proportion above is 30 parts by mass or more, excellent insulation reliability is obtained in using the prepreg, for example, to form an electronic substrate, and when the proportion is 80 parts by mass or less, the obtained electronic substrate is excellent in the mechanical characteristics such as flexural modulus.

By using the curable resin composition of the present invention, a laminate sheet where a cured product composite containing a cured product of the curable resin composition and a base material and a metal foil are laminated one on another, can be formed. The laminate sheet is preferably a laminate sheet where the cured product composite is stacked in close contact with the metal foil, and is suitably used as a material of an electronic substrate. As the metal foil, for example, an aluminum foil and a copper foil may be used, and among others, a copper foil is low in the electrical resistance and therefore, is preferred. The metal foil may be combined with one sheet or a plurality of sheets of the cured product composite, and after the metal foil is stacked on one surface or both surfaces of the composite according to usage, the stack is processed into a laminate sheet. The production method of the laminate sheet includes, for example, a method where a composite (for example, the above-described prepreg) composed of the curable resin composition and a base material is formed and after stacking a metal foil thereon, the curable resin composition is cured to obtain a laminate sheet in which a cured product laminate and a metal foil are laminated one on another. One particularly preferred application of the laminate sheet is a printed wiring board.

In another embodiment, a printed wiring board containing a cured product of the curable resin composition of the present invention and a base material is provided. The printed wiring board of the present invention can be formed, typically by a method of molding the prepreg of the present invention by hot pressure forming. The base material includes the same materials as those described above for the prepreg. The printed wiring board of the present invention is formed using the above-described curable resin composition and therefore, can have excellent insulation reliability and mechanical characteristics.

EXAMPLES

The embodiment of the present invention is described in greater detail below by referring to Examples, but the embodiment of the present invention is not limited to these Examples.

The physical properties in Examples, Comparative Examples and Production Examples were measured by the following methods.

(1) Number Average Molecular Weight of Polyphenylene Ether

The number average molecular weight was determined using gel permeation chromatography analysis (GPC) by comparison with the dissolution time of standard polystyrene of which molecular weight is known.

The measurement was performed using HLC-8220GPC (manufactured by Tosoh Corporation) as the measuring device under the conditions of column: Shodex LF-804x2 (manufactured by Showa Denko K.K.), eluent: chloroform at 50° C. and detector: R1.

(2) Average Number of Phenolic Hydroxyl Groups per Molecule of Polyphenylene Ether The average number of phenolic hydroxyl groups per molecule was determined using the number of phenolic hydroxyl groups contained in the polyphenylene ether as determined from the absorbance and the number of molecules of the polyphenylene ether as determined from the average molecular weight.

First, in accordance with the method described in *Kobunshi Ronbunshu* (*Collection of Papers on Polymers*), Vol., 51, No. 7, page 480 (1994), the number of hydroxyl groups was determined from the value obtained by adding a tetramethylammonium hydroxide solution to a methylene chloride solution of polyphenylene ether and measuring this sample for the change of absorbance at a wavelength of 318 nm by an ultraviolet-visible absorptiometer.

Separately, the number average molecular weight of the polyphenylene ether was determined by gel permeation chromatography according to (1) above, and the number of molecules of the polyphenylene ether was determined using the obtained value. From these values, the average number of hydroxyl groups per molecule of the polyphenylene ether was calculated according to the following formula:

Average number of phenolic hydroxyl groups per molecule=number of hydroxyl groups/number-average number of molecules (3) Resin Flow Rate at Curing of Curable Resin Composition The resin flow rate was determined as a ratio of the mass of the resin flowed out when producing a laminate sheet by molding the prepreg by hot pressure forming, to the original mass (the prepreg subjected to hot pressure forming).

The curable resin composition was mixed with toluene to produce a varnish and after impregnating a glass cloth (2116, produced by Asahi-Schwebel Co., Ltd.) with the varnish, the toluene solvent was removed by drying to produce a prepreg having a resin content of about 60 mass %. Two 150 mm-square sheets were cut out from the prepreg and used as a test piece. Here, the mass (g) of two test pieces was determined and taken as the mass of the laminate sheet precursor.

Subsequently, two test pieces were stacked. The stack was vacuum-pressed under the condition of a pressure of 5 kg/cm$^2$ while heating at a temperature rise rate of 3° C./rain from room temperature; when reached 130° C., vacuum-pressed under the condition of a pressure of 30 kg/cm$^2$ while heating at a temperature rise rate of 3° C./min; and when reached 200° C., vacuum-pressed under the conditions of a pressure of 30 kg/cm$^2$ and a time for 60 minutes while maintaining the temperature at 200° C. The resin flowed out from the 150 mm-square part was removed to obtain a laminate sheet. The mass of this laminate sheet was determined and taken as the mass (g) of the laminate sheet.

Using the mass (g) of the laminate sheet precursor and the mass (g) of the laminate sheet, the resin flow rate (%) at curing of the curable resin composition was determined according to the following formula:

Resin flow rate (%) at curing=(mass (g) of laminate sheet precursor−mass (g) of laminate sheet)/mass (g) of laminate sheet precursor×100

(4) Glass Transition Temperature of Laminate Sheet

The dynamic viscoelasticity of the laminate sheet was measured, and the temperature at which tan 8 becomes maximum was determined.

The measurement was performed using ARESS (manufactured by TA Instruments Japan Inc.) as the measuring device under the conditions of a test piece with a length of about 45 mm, a width of about 12.5 mm and a thickness of about 3 mm, twisting mode, and a frequency of 10 rad/s.

(5) Dielectric Constant and Dielectric Loss Tangent of Laminate Sheet

The dielectric constant and dielectric loss tangent of the laminate sheet at 1 GHz were measured using an impedance analyzer.

Measurement was performed using an impedance analyzer (4291B op. 002 with 16453A, 16454A, manufactured by Agilent Technologies) as the measuring device under the conditions of test piece thickness: about 2 mm, voltage: 100 mV, and frequency: from 1 MHz to 1.8 GHz. Each of the dielectric constant and the dielectric loss tangent was determined as an average value of 100 sweeps.

(6) Water Absorption Percentage of Laminate Sheet

The laminate sheet was subjected to a water absorption accelerated test, and the water absorption percentage was determined from the increase in the mass.

The laminate sheet was cut out into a 50-mm square to produce a test piece and after drying the test piece was at 130° C. for 30 minutes, the mass was measured and taken as the mass (g) before accelerated test. Subsequently, the mass after performing an accelerated test under the conditions of temperature: 121° C., pressure: 2 atm, and time: 4 hours was measured and taken as the mass (g) after accelerated test.

Using the mass (g) before accelerated test and the mass (g) after accelerated test, the water absorption percentage was calculated according to the following formula, and an average value of measured values of 4 test pieces was determined.

Water absorption percentage(mass %)=(mass before accelerated test−mass after accelerated test)/mass before accelerated test×100

(7) Solder Heat Resistance After Water Absorption Test of Laminated Sheet

A solder heat resistance heat at 288° C. and 260° C. was performed using the laminate sheet after measurement of water absorption percentage of (6). The laminate sheet after the water absorption accelerated test was dipped in a solder bath at 288° C. or 260° C. for 20 seconds and then observed with an eye. The laminate sheet where none of swelling, delamination and whitening was observed even after dipping in a solder bath at 288° C. was rated as "solder heat resistance of 288° C."; the laminate sheet where any one or more of swelling, delamination and whitening was generated by dipping in a solder bath at 288° C. but none of swelling, delamination and whitening was observed even after dipping in a solder bath at 260° C. was rated as "solder heat resistance of 260° C."; and the laminate sheet where any one of swelling, delamination and whitening was generated by dipping in a solder bath at 260° was rated as "not passed".

(8) Copper Foil-Peeling Strength of Laminate Sheet

The stress when peeling off the copper foil of a copper-clad laminate sheet at a constant rate was measured. A copper-clad laminate sheet using a 35-μm copper foil (GTS-MP foil, manufactured by Furukawa Electric Co., Ltd.), produced by the later-described method, was cut into a size of 15 mm width×150 mm length and after the average value of loads when the copper foil was peeled off at an angle of 90° with respect to the removal surface at a rate of 50 ram/min was measured using an autograph (AG-5000D, manufactured by Shimadzu Corporation), the average value of 5 measurements was determined.

Raw materials used in Examples, Comparative Examples and Production Examples are as follows.

Polyphenylene Ether:

S202A (produced by Asahi Kasei Chemicals Corp., number average molecular weight: 19,000, average number of phenolic hydroxyl groups per molecule: 1.84)

Low-Molecular-Weight •methacrylated polyphenylene ether:

MX9000 (produced by SABIC, number average molecular weight: 1,100, average number of phenolic hydroxyl groups per molecule: 0.04)

Bisphenol A:

Produced by Tokyo Chemical Industry Co., Ltd.

Mineral Spirit Solution of 6 Mass % Cobalt Naphthenate:

Produced by Wako Pure Chemical Industries, Ltd.

Benzoyl Peroxide Solution:

NYPER BMT K-40 (produced by NOF Corp., a 40 mass % xylene solution of benzoyl peroxide)

Tetrabutylammonium Iodide:

Produced by Wako Pure Chemical Industries, Ltd.

Benzyl Chloride:

Produced by Tokyo Chemical Industry Co., Ltd.

Chloromethylstyrene:

Produced by Wako Pure Chemical Industries, Ltd.

Triallyl isocyanurate:

TAIC (produced by Nippon Kasei Chemical Co., Ltd.)

Styrene-Based Elastomer:

SOE L606 (produced by Asahi Kasei Chemicals Corp.)

Silica:

Spherical silica (produced by Tatsumori Ltd.)

Decabromodiphenylethane:

SAYTEX8010 (produced by Albemarle Japan Corp.)

α,α'-Bis(tert-butylperoxy-m-isopropyl)benzene:

PERBUTYL P (produced by NOF Corp.)

Cresol •Novolak Skeleton Phenol Resin:

Produced by Gun Ei Chemical Industry Co., Ltd., grade: RESITOP PSM-4261

2,6-Xylenol:

Produced by Tokyo Chemical Industry Co., Ltd.

tert-Butylperoxyisopropyl carbonate:

Perbutyl I (produced by NOF Corp.)

Production Example 1

Low-Molecular-Weight •Polyphenylene Ether

A 10-L flask was placed in an oil bath heated at 90° C., and a nitrogen gas was introduced into the flask at 30 ml/min. Subsequent operations were always performed under a nitrogen gas stream. Thereto, 1 kg of polyphenylene ether and 3 kg of toluene were charged and dissolved with stirring. Furthermore, a solution obtained by dissolving 80 g of bisphenol A in 350 g of methanol was added to the flask with stirring. After continuously stirring for 5 minutes, 3 ml of a mineral spirit solution of 6 mass % cobalt naphthenate was added by means of a syringe, and stirring was continued for 5 minutes. Subsequently, a solution obtained by adding 1,125 g of toluene to 375 g of a benzoyl peroxide solution and diluting the solution to a benzoyl peroxide concentration of 10 mass % was put in a dropping funnel and dropped in the flask over 2 hours. After the completion of dropping, heating and stirring were further continued for 2 hours to obtain a molecular weight-reduced polyphenylene ether. The number average molecular weight of the obtained molecular weight-reduced polyphenylene ether was 2,800, and the average number of phenolic hydroxyl groups per molecule was 1.96.

Production Example 2

Low-Molecular-Weight •Benzylated Polyphenylene Ether-1

The process until a polyphenyl ether was precipitated by adding methanol was performed by the same method as in Production Example 1 to obtain a reaction solution containing a low-molecular-weight•polyphenylene ether. The temperature of the reaction solution was lowered to 50° C., and an aqueous solution obtained by dissolving 340 g of sodium hydroxide in 3,050 g of ion-exchanged water and 31 g of tetrabutylammonium iodide were added, followed by stirring for 5 minutes. Furthermore 1,070 g of benzyl chloride was added, and stirring was continued for 4 hours at a temperature of 50° C. to obtain a reaction solution containing a low-molecular-weight •benzylated polyphenylene ether. The low-molecular-weight•benzylated polyphenylene ether by adding a large amount of methanol thereto, separated by filtration and dried to obtain a low-molecular-weight •benzylated polyphenylene ether-1.

The number average molecular weight of the obtained low-molecular-weight•benzylated polyphenylene ether-1 was 3,000, and the average number of phenolic hydroxyl groups per molecule was 0.01.

Production Example 3

Low-Molecular-Weight •Benzylated Polyphenylene Ether-2

A low-molecular-weight•polyphenylene ether was produced in the same manner as in Production Example 1 except for changing the amount of bisphenol A to 100 g, changing the amount of methanol for dissolving bisphenol A to 440 g and changing the amount of benzoyl peroxide solution to 425 g, and a low-molecular-weight•benzylated polyphenylene ether-2 was obtained using the low-molecular-weight•polyphenylene ether by the same method as in Production Example 2. The number average molecular weight of the obtained low-molecular-weight•benzylated polyphenylene ether-2 was 2,400, and the average number of phenolic hydroxyl groups per molecule was 0.02.

Production Example 4

Low-Molecular-Weight •Benzylated Polyphenylene Ether-3

A low-molecular-weight•polyphenylene ether was produced in the same manner as in Production Example 1 except for changing the amount of bisphenol A to 130 g, changing the amount of methanol for dissolving bisphenol A to 570 g and changing the amount of benzoyl peroxide solution to 475 g, and a low-molecular-weight•benzylated polyphenylene ether-3 was obtained using the low-molecular-weight•polyphenylene ether by the same method as in Production Example 2. The number average molecular weight of the obtained low-molecular-weight•benzylated polyphenylene ether was 1,500, and the average number of phenolic hydroxyl groups per molecule was 0.04.

Production Example 5

Low-Molecular-Weight•Vinylbenzylated Polyphenylene Ether

A low-molecular-weight•vinylbenzylated polyphenylene ether was obtained by the same method as in Production Example 2 except for changing the amount of benzyl chloride to 1,070 g and changing the amount of chloromethylstyrene to 1,290 g. The number average molecular weight of the obtained low-molecular-weight •vinylbenzylated polyphenylene ether was 3,100, and the average number of phenolic hydroxyl groups per molecule was 0.05.

Examples 1 to 9 and Comparative Examples 1 to 6

A varnish of the resin composition shown in Table 1 was mixed using toluene to prepare a varnish. A glass cloth ("2116", trade name, produced by Asahi-Schwebel Co., Ltd.) was impregnated with the obtained varnish and then dried to obtain a prepreg having a resin content of 60 mass %. Using this prepreg, the resin flow rate at curing was measured by the method described above.

Also, a laminate obtained by stacking 2 sheets of the prepared prepreg and laminating a 12 μm-thick copper foil (GTS-MP foil, manufactured by Furukawa Electric Co., Ltd.) on the top and bottom of the stack was vacuum-pressed under the condition of a pressure of 5 kg/cm$^2$ while heating at a temperature rise rate of 3° C./rain from room temperature; when reached 130° C., vacuum-pressed under the condition of a pressure of 30 kg/cm$^2$ while heating at a temperature rise rate of 3° C./min; and when reached 200° C., vacuum-pressed under the conditions of a pressure of 30 kg/cm$^2$ and a time for 60 minutes while maintaining the temperature at 200° C., whereby a double-sided copper-clad laminate sheet was obtained. Subsequently, the copper-clad laminate sheet was cut into a 100-mm square, and the copper foil was removed by etching to obtain a sample for evaluating the glass transition temperature, water absorption percentage, and solder heat resistance after water absorption test.

In addition, a laminate obtained by stacking 2 sheets of the prepared prepreg and laminating a 35 μm-thick copper foil (GTS-MP foil, manufactured by Furukawa Electric Co., Ltd.) on the top and bottom of the stack was vacuum-pressed under the condition of a pressure of 5 kg/cm$^2$ while heating at a temperature rise rate of 3° C./rain from room temperature; when reached 130° C., vacuum-pressed under the condition of a pressure of 30 kg/cm$^2$ while heating at a temperature rise rate of 3° C./min; and when reached 200° C., vacuum-pressed under the conditions of a pressure of 30 kg/cm$^2$ and a time for 60 minutes while maintaining the temperature at 200° C., whereby a double-sided copper-clad laminate sheet was produced. This double-sided copper-clad laminate sheet was used as a sample for copper foil-peeling strength measurement.

Furthermore, a stack obtained by stacking 16 sheets of the prepreg prepared above was vacuum-pressed under the condition of a pressure of 5 kg/cm$^2$ while heating at a temperature rise rate of 3° C./min from room temperature; when reached 130° C., vacuum-pressed under the condition of a pressure of 30 kg/cm$^2$ while heating at a temperature rise rate of 3° C./rain; and when reached 200° C., vacuum-pressed under the conditions of a pressure of 30 kg/cm$^2$ and a time for 60 minutes while maintaining the temperature at 200° C., whereby a laminate sheet was produced. This laminate sheet was cut into a 100-mm square and used as a sample for measurement of dielectric constant and dielectric loss tangent.

Using the prepreg, double-sided copper-clad laminate sheet (two types of copper foils of 12 μm and 35 μm) or laminate sheet, the glass transition temperature, resin flow rate at curing, copper foil-peeling strength, dielectric constant, dielectric loss tangent, water absorption percentage, and solder heat resistance after water absorption were measured, and the results are shown in Table 1.

As seen in Table 1, in all of Examples 1 to 9, the resin flow rate was 0.3% or more and is large, the dielectric loss tangent was 0.005 or less and is small, and the glass transition temperature was 170° C. or more and is high. The laminate sheets of Examples 1 to 9 were revealed to have high copper foil-peeling strength, good water absorption resistance and excellent solder heat resistance.

On the other hand, in Comparative Examples 1 to 6, at least any one of the resin flow rate, the dielectric loss tangent, the glass transition temperature, the copper foil-peeling strength, the water absorption resistance and the solder heat resistance was poor. In Comparative Example 1 using a mixture of a polyphenylene ether with the terminal being unfunctionalized and a low-molecular-weight•polyphenylene ether, the glass transition temperature was low, the dielectric loss tangent was high, and the water absorption resistance and solder heat resistance were bad. In Comparative Example 2 using an unfunctionalized polyphenylene ether, moldability was bad and starvation was generated in the laminate sheet. In this Example, a laminate sheet strong sufficient to withstand evaluation was not obtained and therefore, other items could not be evaluated. In Comparative Example 3 using a n unfunctionalized polyphenylene ether and using a large amount of triallyl isocyanurate, the dielectric loss tangent was high and the copper foil-peeling strength was low. In Comparative Example 4 where an unfunctionalized polyphenylene ether and a low-molecular-weight•benzylated polyphenylene ether were mixed in a ratio of 50:50 (by mass), the glass transition temperature was low, and the copper foil-peeling strength and solder heat resistance were bad. In Comparative Example 5 using an unfunctionalized polyphenylene ether and a low-molecular-weight•vinylbenzylated polyphenylene ether in a mixing ratio of 46:54 (by mass), the copper foil-peeling strength was low and the solder heat resistance was bad. In Comparative Example 6 using a low-molecular-weight•vinylbenzylated polyphenylene ether, the copper foil-peeling strength was low and the solder heat resistance was bad.

Reference Example

With respect to the benzylated polyphenylene ether in this disclosure, Reference Examples are set forth below. In these Reference Examples, the number average molecular weight is a value by GPC measurement performed by the following method.

[GPC Measurement]

The measurement was performed using Shodex GPC K-806Lx3 for the column, chloroform at 40° C. for the eluent, and RI (refractometer) for the detector, and from the relational expression of the molecular weight of a standard polystyrene sample measured under the same conditions and the dissolution time, the number average molecular weight was calculated.

[Evaluation Test of Solubility of Benzylated Polyphenylene Ether]

A curable resin composition (C1) was prepared by mixing 8.1 g of benzylated polyphenylene ether, 3.5 g of TAIL, 0.24 g of styrene-based elastomer, and 0.70 g of tert-butylperoxy-isopropyl carbonate. The compositional ratio between benzylated polyphenylene ether and TALC of C1 was [benzylated polyphenylene ether]/[TAIC]=69.8/30.2 [by mass]. C1 was mixed with 7.8 g of toluene, and the mixture was stirred at room temperature (23° C.). In Table 2, when the benzylated polyphenylene ether was dissolved after stirring for 6 hours, the solubility is rated “passed”, and when not dissolved, this is rated “failed”.

Reference Example 1A

A 1-L flask was placed in an oil bath heated at 90° C., and a nitrogen gas was introduced into the flask at 30 ml/min. Subsequent operations were always performed under a nitrogen gas stream. Thereto, 100 g of polyphenylene ether and 300 g of toluene were charged and dissolved with stirring. Furthermore, a solution obtained by dissolving 8 g of bisphenol A in 35 g of methanol was added to the flask with stirring. After continuously stirring for 5 minutes, 0.3 ml of a mineral spirit solution of 6 mass % cobalt naphthenate was added by means of a syringe, and stirring was continued for 5 minutes. Subsequently, a solution obtained by adding 112.5 g of toluene to 37.5 g of a benzoyl peroxide solution and diluting the solution to a benzoyl peroxide concentration of 10 mass % was put in a dropping funnel and dropped in the flask over 2 hours. After the completion of dropping, heating and stirring were further continued for 2 hours to obtain a reaction solution (R1). When 5 ml of R1 was sampled and added to 100 ml of methanol with stirring, a precipitate was obtained as a brown solid. The precipitate was separated by filtration and dried to obtain a benzylated polyphenylene ether (P1). As a result of analysis of P1, the number average molecular weight was 2,500, and the number of phenolic hydroxyl groups per molecule was 1.9.

The temperature of R1 was lowered to 50° C., and an aqueous solution obtained by dissolving 34 g of sodium hydroxide in 305 g of ion-exchanged water and 3.1 g of tetrabutylammonium iodide were added, followed by stirring for 5 minutes. Furthermore, 107 g of benzyl chloride was added, and stirring was continued for 4 hours at a temperature of 50° C. to obtain a reaction solution (R2). When 5 ml of R2 was sampled and added to 100 ml of methanol with stirring, a precipitate was obtained as a brown solid. The precipitate was separated by filtration and dried to obtain a benzylated polyphenylene ether (P2). As a result of analysis of P2, the number average molecular weight was 3,000, and the number of phenolic hydroxyl groups per molecule was 0.01. An evaluation test of solubility of P2 was performed. The result is shown in Table 2.

Reference Example 2A

A benzylated polyphenylene ether (P3) was obtained by performing the production in the same manner as in Reference Example 1A except for changing the amount of benzyl chloride to 53.5 g. As a result of analysis of P3, the number average molecular weight was 2,800, and the number of phenolic hydroxyl groups per molecule was 0.02. An evaluation test of solubility of P3 was performed. The result is shown in Table 2.

Reference Example 3A

A benzylated polyphenylene ether (P4) was obtained by performing the production in the same manner as in Reference Example 1A except for changing the amount of benzyl chloride to 26.8 g. As a result of analysis of P4, the number average molecular weight was 2,700, and the number of phenolic hydroxyl groups per molecule was 0.13. An evaluation test of solubility of P4 was performed. The result is shown in Table 2.

Reference Example 4A

A 1-L flask was placed in an oil bath heated at 90° C., and a nitrogen gas was introduced into the flask at 3 ml/min. Subsequent operations were always performed under a nitrogen gas stream. Thereto, 100 g of polyphenylene ether, 300 g of toluene and 1.0 g of 2,6-xylenol were charged and dissolved with stirring. After continuously stirring for 5 minutes, 0.3 ml of a mineral spirit solution of 6 mass % cobalt naphthenate was added by means of a syringe, and stirring was continued for 5 minutes. Subsequently, a solution obtained by adding 22.5 g of toluene to 7.5 g of a benzoyl peroxide solution and diluting the solution to a concentration of 10 mass % was put in a dropping funnel and dropped in the flask over 2 hours. After the completion of dropping, heating and stirring were further continued for 2 hours to obtain a reaction solution (R3). A solution obtained by dissolving 8.0 g of cresol•novolak skeleton phenol resin in 48 g of butanol was added to R3 and after continuously stirring for 5 minutes, a solution obtained by adding 75 g of toluene to 25 g of a benzoyl peroxide solution and diluting it to a concentration of 10 mass % was put in a dropping funnel and dropped in the flask over 2 hours. After the completion of dropping, heating and stirring were further continued for 2 hours. The temperature of this reaction solution was lowered to 50° C., and an aqueous solution obtained by dissolving 34 g of sodium hydroxide in 305 g of ion-exchanged water and 3.1 g of tetrabutylammonium iodide were added, followed by stirring for 5 minutes. Furthermore, 107 g of benzyl chloride was added, and stirring was continued for 4 hours at a temperature of 50° C. to obtain a reaction solution (R3). When 5 ml of R3 was sampled and added to 100 ml of methanol with stirring, a precipitate was obtained as a brown solid. The precipitate was separated by filtration and dried to obtain a benzylated polyphenylene ether (P5). As a result of analysis of P5, the number average molecular weight was 3,600, and the number of phenolic hydroxyl groups per molecule was 0.07. An evaluation test of solubility of P5 was performed. The result is shown in Table 2.

Reference Example 5A

A benzylated polyphenylene ether (P6) was obtained by performing the production in the same manner as in Reference Example 1A except for not using tetrabutylammonium iodide. As a result of analysis of P6, the number average molecular weight was 3,000, and the number of phenolic hydroxyl groups per molecule was 0.22. The result of an evaluation test of solubility is shown in Table 2.

Reference Example 6A

A benzylated polyphenylene ether (P7) was obtained by performing the production in the same manner as in Reference Example 4A except for using 1.0 g of 2,6-xylenol in place of the butanol solution of cresol•novolak skeleton phenol resin. As a result of analysis of P7, the number average molecular weight was 7,300, and the number of phenolic hydroxyl groups per molecule was 0.01. The result of an evaluation test of solubility is shown in Table 2.

Reference Example 1B

A benzylated polyphenylene ether (P8) was obtained by performing the production in the same manner as in Reference Example 1A except for changing the amount of benzyl chloride to 5.4 g. As a result of analysis of P8, the number average molecular weight was 2,800, and the number of phenolic hydroxyl groups per molecule was 1.1. When an evaluation test of curing reactivity was performed, the composition was soft, and unreacted TAIC remained on the surface. The evaluation result of solubility is shown in Table 3.

Reference Example 2B

A benzylated polyphenylene ether (P9) was obtained by performing the production in the same manner as in Reference Example 1A except for changing the amount of benzyl chloride to 13.4 g. As a result of analysis of P9, the number average molecular weight was 2,900, and the number of phenolic hydroxyl groups per molecule was 0.8. The evaluation result of solubility is shown in Table 3.

Reference Example 3B

An aqueous solution obtained by dissolving 34 g of sodium hydroxide in 305 g of ion-exchanged water and 3.1 g of tetrabutylammonium iodide were added to R3 obtained by the same method as in Reference 4A, followed by stirring for 5 minutes. Furthermore, 107 g of benzyl chloride was added, and stirring was continued for 4 hours at a temperature of 50° C. to obtain a benzylated polyphenylene ether (P10). As a result of analysis of P10, the number average molecular weight was 12,000, and the number of phenolic hydroxyl groups per molecule was 0.01. When the above-described evaluation test of solubility was performed, P10 was not dissolved completely, and an insoluble portion was observed.

TABLE 1

| | | | Example 1 | Example 2 | Example 3 | Example 4 | Example 5 | Example 6 |
|---|---|---|---|---|---|---|---|---|
| Composition (parts by mass) | Polyphenylene ether | Polyphenylene ether (Mn: 19,000) | 25.1 | 29.3 | 33.5 | 37.7 | 39.8 | 37.7 |
| | | Low-molecular-weight. polyphenylene ether (Mn: 2,800) | | | | | | |
| | | Low-molecular-weight•benzylated polyphenylene ether-1 (Mn: 3,000) | 16.8 | 12.6 | 8.4 | 4.2 | 2.1 | |
| | | Low-molecular-weight•benzylated polyphenylene ether-2 (Mn: 2,400) | | | | | | |
| | | Low-molecular-weight•benzylated polyphenylene ether-3 (Mn: 1,500) | | | | | | |
| | | Low-molecular-weight•vinyl-benzylated polyphenylene ether (Mn: 3,100) | | | | | | 4.2 |
| | | Low-molecular-weight• methacrylated polyphenylene ether (Mn: 1,050) | | | | | | |
| | | Average number of phenolic hydroxyl groups per molecule (groups) | 0.35 | 0.50 | 0.71 | 1.08 | 1.38 | 1.08 |
| | Triallyl isocyanurate | | 19.0 | 19.0 | 19.0 | 19.0 | 19.0 | 19.0 |
| | Styrene-based elastomer | | 2.6 | 2.6 | 2.6 | 2.6 | 2.6 | 2.6 |
| | Silica | | 20.0 | 20.0 | 20.0 | 20.0 | 20.0 | 20.0 |
| | Decabromodiphenylethane | | 15.2 | 15.2 | 15.2 | 15.2 | 15.2 | 15.2 |
| | α,α'-Bis(tert-butylperoxy-m-isopropyl)benzene | | 1.3 | 1.3 | 1.3 | 1.3 | 1.3 | 1.3 |

TABLE 1-continued

| | | | | | | | | |
|---|---|---|---|---|---|---|---|---|
| Characteristics | Resin flow rate at curing (mass %) | 5.6 | 4 | 3.1 | 2.1 | 1.1 | 2.4 |
| | Glass transition temperature (° C.) | 175 | 183 | 190 | 198 | 203 | 195 |
| | Dielectric loss tangent | 0.002 | 0.002 | 0.002 | 0.002 | 0.002 | 0.003 |
| | Dielectric constant | 3.7 | 3.6 | 3.6 | 3.6 | 3.6 | 3.6 |
| | Copper foil-peeing strength (N/mm) | 1.41 | 1.49 | 1.55 | 1.61 | 1.66 | 1.35 |
| | Water absorption percentage (wt %) | 0.24 | 0.23 | 0.2 | 0.19 | 0.14 | 0.29 |
| | Solder heat resistance | 288° C. | 288° C. | 288° C. | 288° C. | 288° C. | 288° C. |

| | | | Example 7 | Example 8 | Example 9 | Comparative Example 1 | Comparative Example 2 |
|---|---|---|---|---|---|---|---|
| Composition (parts by mass) | Polyphenylene ether | Polyphenylene ether (Mn: 19,000) | 37.7 | | | 33.5 | 41.9 |
| | | Low-molecular-weight• polyphenylene ether (Mn: 2,800) | | | | 8.4 | |
| | | Low-molecular-weight•benzylated polyphenylene ether-1 (Mn: 3,000) | | | | | |
| | | Low-molecular-weight•benzylated polyphenylene ether-2 (Mn: 2,400) | | 4.2 | | | |
| | | Low-molecular-weight•benzylated polyphenylene ether-3 (Mn: 1,500) | | | 4.2 | | |
| | | Low-molecular-weight•vinyl-benzylated polyphenylene ether (Mn: 3,100) | 4.2 | | | | |
| | | Low-molecular-weight•methacrylated polyphenylene ether (Mn: 1,050) | | | | | |
| | | Average number of phenolic hydroxyl groups per molecule (groups) | 1.08 | 0.98 | 0.76 | 1.94 | 1.84 |
| | Triallyl isocyanurate | | 19.0 | 19.0 | 19.0 | 19.0 | 19.0 |
| | Styrene-based elastomer | | 2.6 | 2.6 | 2.6 | 2.6 | 2.6 |
| | Silica | | 20.0 | 20.0 | 20.0 | 20.0 | 20.0 |
| | Decabromodiphenylethane | | 15.2 | 15.2 | 15.2 | 15.2 | 15.2 |
| | α,α'-Bis(tert-butylperoxy-m-isopropyl)benzene | | 1.3 | 1.3 | 1.3 | 1.3 | 1.3 |
| Characteristics | Resin flow rate at curing (mass %) | | 2.1 | 2.9 | 4.1 | 4.2 | 0.2 |
| | Glass transition temperature (° C.) | | 210 | 202 | 180 | 166 | — |
| | Dielectric loss tangent | | 0.003 | 0.002 | 0.002 | 0.009 | — |
| | Dielectric constant | | 3.7 | 3.6 | 3.6 | 3.7 | — |
| | Copper foil-peeing strength (N/mm) | | 1.3 | 1.46 | 1.41 | 1.70 | — |
| | Water absorption percentage (wt %) | | 0.3 | 0.19 | 0.22 | 0.39 | — |
| | Solder heat resistance | | 288° C. | 288° C. | 288° C. | none pass | — |

| | | | Comparative Example 3 | Comparative Example 4 | Comparative Example 5 | Comparative Example 6 |
|---|---|---|---|---|---|---|
| Composition (parts by mass) | Polyphenylene ether | Polyphenylene ether (Mn: 19,000) | 39.0 | 21.0 | 19.3 | |
| | | Low-molecular-weight•polyphenylene ether (Mn: 2,800) | | | | |
| | | Low-molecular-weight•benzylated polyphenylene ether-1 (Mn: 3,000) | | 21.0 | | |
| | | Low-molecular-weight•benzylated polyphenylene ether-2 (Mn: 2,400) | | | | |
| | | Low-molecular-weight•benzylated polyphenylene ether-3 (Mn: 1,500) | | | | |
| | | Low-molecular-weight•vinyl-benzylated polyphenylene ether (Mn: 3,100) | | | 22.6 | 41.9 |
| | | Low-molecular-weight•methacrylated polyphenylene ether (Mn: 1,050) | | | | |
| | | Average number of phenolic hydroxyl groups per molecule (groups) | 1.84 | 0.25 | 0.22 | 0 |
| | Triallyl isocyanurate | | 35.0 | 19.0 | 19.0 | 19.0 |
| | Styrene-based elastomer | | 3.0 | 2.6 | 2.6 | 2.6 |
| | Silica | | | 20.0 | 20.0 | 20.0 |
| | Decabromodiphenylethane | | 19.0 | 15.2 | 15.2 | 15.2 |
| | α,α'-Bis(tert-butylperoxy-m-isopropyl)benzene | | 4.0 | 1.3 | 1.3 | 1.3 |
| Characteristics | Resin flow rate at curing (mass %) | | 4.00 | 9.0 | 10.2 | 13.2 |
| | Glass transition temperature (° C.) | | 175 | 160 | 178 | 198 |
| | Dielectric loss tangent | | 0.012 | 0.002 | 0.003 | 0.003 |
| | Dielectric constant | | 3.8 | 3.6 | 3.6 | 3.6 |
| | Copper foil-peeing strength (N/mm) | | 1.18 | 1.15 | 0.81 | 0.70 |
| | Water absorption percentage (wt %) | | 0.54 | 0.34 | 0.34 | 0.39 |
| | Solder heat resistance | | 288° C. | 260° C. | 260° C. | 260° C. |

TABLE 2

| | | Reference Example 1A | Reference Example 2A | Reference Example 3A | Reference Example 4A | | Reference Example 5A | Reference Example 6A | |
|---|---|---|---|---|---|---|---|---|---|
| Synthesis of benzylated polyphenylene ether | Phenol added, parts by mass (per 100 part by mass of PPE) | bisphenol A 8 | bisphenol A 8 | bisphenol A 8 | 2,6-xylenol 1 | cresol novolak skeleton 8 | bisphenol A 8 | 2.6-xylenol 1 | 2.6-xylenol 1 |
| | Tetrabutylammonium iodide, parts by mass (per 100 part by mass of PPE) | 3.1 | 3.1 | 3.1 | 3.1 | | 0 | 3.1 | |
| | Benzyl chloride, parts by mass (per 100 part by mass of PPE) | 107 | 53.5 | 26.8 | 107 | | 107 | 107 | |
| Analysis of polymer synthesized | Polymer | P2 | P3 | P4 | P5 | | P6 | P7 | |
| | Number average molecular weight | 3,000 | 2,800 | 2,700 | 3,600 | | 3,000 | 7,300 | |
| | Number of OH groups per molecular chain | 0.01 | 0.02 | 0.13 | 0.07 | | 0.22 | 0.01 | |
| | Solubility | passed | passed | passed | passed | | passed | passed | |

TABLE 3

| | | Reference Example 1B | Reference Example 2B | Reference Example 3B |
|---|---|---|---|---|
| Synthesis of benzylated polyphenylene ether | Phenol added, parts by mass (per 100 part by mass of PPE) | bisphenol A 8 | bisphenol A 8 | 2,6-xylenol 1 |
| | Tetrabutylammonium iodide, parts by mass (per 100 part by mass of PPE) | 3.1 | 3.1 | 3.1 |
| | Benzyl chloride, parts by mass (per 100 part by mass of PPE) | 5.4 | 13.4 | 107 |
| Analysis of polymer synthesized | Polymer | P8 | P9 | P10 |
| | Number average molecular weight | 2,800 | 2,900 | 12,000 |
| | Number of OH groups per molecular chain | 1.1 | 0.8 | 0.01 |
| | Solubility | passed | passed | failed |

Embodiment examples of the present invention have been described above, but the present invention is not limited to these embodiments, and various modifications can be made therein without departing from the spirit and scope of claims.

The invention claimed is:

1. A curable resin composition comprising a polyphenylene ether, wherein:

the average number of phenolic hydroxyl groups per molecule of said polyphenylene ether is 0.3 or more, the resin flow rate of said curable resin composition at curing as measured under the following conditions is from 0.3 to 15%, a sample for dielectric loss tangent measurement produced from said curable resin composition under the following conditions has a dielectric loss tangent at 1 GHz of 0.005 or less, a sample for glass transition temperature measurement produced from said curable resin composition under the following conditions has a glass transition temperature of 170° C. or more, assuming that two 150 mm-square prepreg sheets obtained by impregnating a glass cloth specified by IPC Style 2116 with said curable resin composition to have a resin content of 60±2 mass % are stacked to obtain a laminate sheet precursor and a laminate sheet is produced by molding said laminate sheet precursor under the following condition (a) and removing the resin part flowed out, said resin flow rate at curing is a value calculated from the mass (g) of said laminate sheet and the mass (g) of said laminate sheet precursor according to the following formula:

Resin flow rate (%) at curing=(mass (g) of laminate sheet precursor−mass (g) of laminate sheet)/mass (g) of laminate sheet precursor×100, said sample for dielectric loss tangent measurement is molded under the following condition (a) after stacking 16 prepreg sheets obtained by impregnating a glass cloth specified by IPC Style 2116 with the curable resin composition to have a resin content of 60±2 mass %, and said sample for glass transition temperature measurement is molded under the following condition (a) after stacking 2 prepreg sheets obtained by impregnating a glass cloth specified by IPC Style 2116 with the curable resin composition to have a resin content of 60±2 mass %, Condition (a):

vacuum pressing is performed under the condition of a pressure of 5 kg/cm$^2$ while heating at a temperature rise rate of 3° C./min from room temperature; when reached 130° C., vacuum pressing is performed under the condition of a pressure of 30 kg/cm$^2$ while heating at a temperature rise rate of 3° C./min; and when reached 200° C., vacuum pressing is performed under the conditions of a pressure of 30 kg/cm$^2$ and a time for 60 minutes while maintaining the temperature at 200° C.

2. The curable resin composition according to claim 1, wherein said polyphenylene ether contains (A-1) a polyphenylene ether component having an average number of phenolic hydroxyl groups per molecule of less than 0.5 and having a number average molecular weight of 1,000 to 8,000, in an amount of 1 to 40 mass % based on the total amount of the polyphenylene ether.

3. The curable resin composition according to claim 1, wherein said polyphenylene ether contains (A-1) a polyphenylene ether component having an average number of phenolic hydroxyl groups per molecule of less than 0.5 and having a number average molecular weight of 1,000 to 8,000, and (A-2) a polyphenylene ether component having a number average molecular weight in excess of 8,000, the content of said (A-1) is from 1 mass % to less than 40 mass % and the content of said (A-2) is from more then 60 mass % to 99 mass %, based on 100 mass % of the total mass of said (A-1) and said (A-2).

4. The curable resin composition according to claim 2, wherein said (A-1) polyphenylene ether component having an average number of phenolic hydroxyl groups per molecule of less than 0.5 and having a number average molecular weight of 1,000 to 8,000 is a benzylated polyphenylene ether having a structure in which at least one phenolic hydroxyl group at the molecular terminal of a polyphenylene ether is substituted with a benzyl group.

5. The curable resin composition according to claim 3, wherein said (A-1) polyphenylene ether component having an average number of phenolic hydroxyl groups per molecule of less than 0.5 and having a number average molecular weight of 1,000 to 8,000 is a benzylated polyphenylene ether having a structure in which at least one phenolic hydroxyl group at the molecular terminal of a polyphenylene ether is substituted with a benzyl group.

6. The curable resin composition according to claim 1, containing (A) said polyphenylene ether, (B) a monomer having two or more vinyl groups within the molecule and (C) a reaction initiator, wherein the content of said monomer (B) is from 10 to 70 parts by mass and the content of said reaction initiator (C) is from 1 to 10 parts by mass, per 100 parts by mass of the total of said polyphenylene ether (A) and said monomer (B).

7. The curable resin composition according to claim 6, wherein said monomer (B) is triallyl isocyanurate (TAIC).

8. The curable resin composition according to claim 6, further containing a flame retardant.

9. The curable resin composition according to claim 7, further containing a flame retardant.

10. A prepreg for a printed wiring board, containing the curable resin composition according to claim 1 and a base material.

11. A printed wiring board, containing a cured product of the curable resin composition according to claim 1 and a base material.

* * * * *